(12) United States Patent
Crompvoets et al.

(10) Patent No.: US 10,211,187 B2
(45) Date of Patent: Feb. 19, 2019

(54) LIGHT EMITTING DIODES AND REFLECTOR

(71) Applicant: KONINKLIJKE PHILIPS N.V., Eindhoven (NL)

(72) Inventors: Floris Maria Hermansz Crompvoets, Bunde (NL); Norbertus Antonius Maria Sweegers, Lierop (NL); Hugo Johan Cornelissen, Escharen (NL); Marc Andre de Samber, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/326,484

(22) PCT Filed: Jul. 18, 2015

(86) PCT No.: PCT/EP2015/066503
§ 371 (c)(1),
(2) Date: Jan. 14, 2017

(87) PCT Pub. No.: WO2016/009088
PCT Pub. Date: Jan. 21, 2016

(65) Prior Publication Data
US 2017/0207202 A1  Jul. 20, 2017

(30) Foreign Application Priority Data
Jul. 18, 2014 (EP) .................... 14177590

(51) Int. Cl.
*H01L 25/075* (2006.01)
*H01L 33/46* (2010.01)
(Continued)

(52) U.S. Cl.
CPC .......... *H01L 25/0753* (2013.01); *F21K 9/90* (2013.01); *H01L 33/46* (2013.01); *H01L 33/504* (2013.01);
(Continued)

(58) Field of Classification Search
CPC ....... H01L 33/60; H01L 33/507; H01L 33/58; H01L 33/62; H01L 33/56; H01L 33/505;
(Continued)

(56) References Cited

U.S. PATENT DOCUMENTS

2008/0290362 A1  11/2008  Zhang et al.
2010/0320479 A1*  12/2010  Minato ................. H01L 33/505
257/88
(Continued)

FOREIGN PATENT DOCUMENTS

DE  102007011123 A1  9/2008
DE  102012214219 A1  2/2014
(Continued)

OTHER PUBLICATIONS

EPO as ISA, "International Search Report and Written Opinion" dated Sep. 30, 2015 from International Application No. PCT/EP2015/066503, filed Jul. 18, 2015, 11 pages.
(Continued)

*Primary Examiner* — Mohammed R Alam

(57) ABSTRACT

A light source includes first and second semiconductor diode structures adapted to generate light, a light output section at least partially overlapping both of the first and the second semiconductor diode structures and being adapted to output light from the first and the second semiconductor diode structures, and a light reflecting structure at least partially enclosing side surfaces of the first and the second semiconductor diode structures and the light output section and being adapted to reflect light from the first and the second semiconductor diode structures towards the light output section. The area of the light output section is less than the combined area of the first and the second semiconductor diode structures.

18 Claims, 6 Drawing Sheets

(51) Int. Cl.
*H01L 33/50* (2010.01)
*H01L 33/60* (2010.01)
*F21K 9/90* (2016.01)
*H01L 33/58* (2010.01)
*F21Y 115/10* (2016.01)

(52) U.S. Cl.
CPC ........... *H01L 33/60* (2013.01); *F21Y 2115/10* (2016.08); *H01L 33/58* (2013.01); *H01L 2924/0002* (2013.01); *H01L 2933/0025* (2013.01); *H01L 2933/0058* (2013.01)

(58) Field of Classification Search
CPC ....... H01L 25/0753; H01L 2224/73253; H01L 2224/14; H01L 2224/16225; H01L 2933/0091; H01L 33/54; H01L 33/44
See application file for complete search history.

(56) References Cited

U.S. PATENT DOCUMENTS

| | | | | |
|---|---|---|---|---|
| 2011/0025190 A1* | 2/2011 | Jagt | ........................ | H01L 33/58 313/499 |
| 2011/0210369 A1* | 9/2011 | Daicho | ................. | H01L 33/505 257/98 |
| 2014/0061704 A1* | 3/2014 | Yamada | ................. | H01L 33/62 257/98 |
| 2014/0091329 A1* | 4/2014 | Lee | .......................... | F21K 9/00 257/88 |

FOREIGN PATENT DOCUMENTS

| | | |
|---|---|---|
| DE | 102012110774 A1 | 5/2014 |
| EP | 2216834 A1 | 8/2010 |
| EP | 2573812 A2 | 3/2013 |
| WO | 2006016324 A1 | 2/2006 |

OTHER PUBLICATIONS

Extended European Search Report dated Jan. 22, 2015, European Application No. 14177590.8, 7 pages.

CN First Office Action issued Nov. 8, 2018, China Patent Application No. 201580038991.5, 8 pages.

\* cited by examiner

LIGHT EMITTING DIODES AND REFLECTOR

CROSS-REFERENCE TO RELATED APPLICATIONS

The present application is a § 371 application of International Application No. PCT/EP2015/066503 filed on Jul. 18, 2015 and entitled "LIGHT EMITTING DIODES AND REFLECTORS," which claims the benefit of European Patent Application No. 14177590.8 files On Jul. 18, 2014. International Application No. PCT/EP2015/066503 and European Patent Application No. 14177590.8 are incorporated herein.

FIELD OF THE INVENTION

This invention relates to a light source, and more particularly to a light source comprising a plurality of semiconductor light sources.

BACKGROUND OF THE INVENTION

Semiconductor light sources, such as light emitting diodes (LEDs), high power LEDs, organic LEDs (OLEDs) and laser diodes are known to be energy efficient and small light sources that can exhibit a small/low etendue (i.e. the product of emitting area with solid angle in which the light is emitted).

Such semiconductor light sources may therefore be beneficial for applications where a bright light source is needed. Typical example applications include projection systems, automotive lighting, camera flashlights, and spot lights. For these examples, improved miniaturization is often desirable. However, merely reducing the size of a semiconductor light source reduces the generated light flux.

It is known to obtain increased luminance from a semiconductor light source by means of a mix box with a small aperture (i.e. light output section) from which the light can escape. FIGS. 1A and 1B illustrate a known LED-based light source 10 employing this concept, wherein light generated by an LED 12 (on a die substrate 14) is recycled/reflected in a mix box 16 having high reflectivity until it escapes via a small aperture 18. By the aperture 18 being "small" it is simply meant as being smaller than the LED 12 such that the aperture area $A_A$ (i.e. width $W_A \times L_A$) is less than the LED area $A_{LED}$ (i.e. width $W_{LED} \times L_{LED}$) of the LED 12.

SUMMARY OF THE INVENTION

The invention is defined by the claims.

According to an aspect of the invention there is provided a light source comprising: first and second semiconductor diode structures adapted to generate light, the first and second semiconductor diode structures being laterally adjacent to each other; a light output section at least partially overlapping both of the first and second semiconductor diode structures and adapted to output light from the first and second semiconductor diode structures; and a light reflecting structure at least partially enclosing side surfaces of the first and second semiconductor diode structures and the light output section and adapted to reflect light from the semiconductor diode structures towards the light output section, wherein the area of the light output section is less than the combined area of the first and second semiconductor diode structures.

Embodiments may achieve savings in materials and/or space by arranging light emitting semiconductor diode structures (such as LEDs) to be laterally adjacent and then sharing a single light output section between the adjacent diode structures. Thus, there is proposed a concept for forming a high luminance LED-based light source that has a light output section which is of lesser area than the light generating portions (e.g. semiconductor diode structures). By arranging such a light output section to at least partially overlap a plurality of light generating structures, the light output section can comprise a single component/structure (such as an aperture or an phosphorescent platelet, for example) that is shared across multiple light sources to provide savings/reductions in materials, size, device complexity, and/or manufacturing complexity.

In other words, embodiments may provide a high-luminance light source comprising laterally arranged sub-sources that are overlapped by a common light output section. The position(s) and/or shape of the light output section can be changed or designed to enable tiling of the sub-sources such that edges of multiple light output sections can be closely aligned (when viewed from above, for example).

Multiple LED light sources may therefore be strategically arranged in the horizontal axis so that they are overlapped by a single or common light output section. For example, pairs of closely positioned LED light sources may be aligned with each other to form a column-like array of pairs such that, when viewed from directly above (i.e. plan view), a single elongate light output section can at least partially overlap each pair of LED light sources in the array. By arranging multiple LED light sources to be overlapped by a common light output section, savings in material and/or space (e.g. a reduction in foot print size) may be achieved.

The LED light sources of the present disclosure may be any type of LED, such as a Flip Chip type (Thin Film Flip Chip), Patterned Sapphire Substrate, top connected/top emission, top-bottom connected. Also, the light source could be used as naked die, or packaged.

A light output section (or light emission area) of an LED light source refers to an area towards or through which light from the LED is output (or emitted). A cavity or cavities of a LED light source may thus extend towards the light output section. The light output section may for example be an area (volume) of the growing template (growth substrate), such as a sapphire. Light from the semiconductor structures may be emitted in various directions, thus resulting in some emitted light being incident on the light reflecting structure and reflected back towards the semiconductor structure(s). Light generated by the semiconductor structures may therefore be reflected by the light reflecting structure until it is directed through (and out of) the light output section. The arrangement of the light reflecting structure and the light output section may therefore be considered as forming a 'mix-box' structure which reflects light rays until they are output through the light output section. Accordingly the light output direction (from the light output section) may be generalized to be in a vertical direction (e.g. upwardly in the Figures) along which light is output from the light output section. However, it will be understood that not all light output from a light output section may be output exactly vertically. Thus, the light output direction should be understood to refer to the general upwardly extending direction that light may be output from a light output section, extending away from the surface of the light output section for example.

The semiconductor diode structures may be arranged such that there is substantially zero separation between adjacent edges of the semiconductor diode structures. In practice, however, it may be difficult to perfectly align adjacent edges to have zero lateral separation. Thus, in embodiments, the semiconductor diode structures may be laterally separated by a negligible or small amount. For example, there may be a lateral separation between the adjacent edges of the two semiconductor diode structures, and this lateral separation or overlap may be less than 10% of the lateral width of the semiconductor diode structures. In embodiments, it may be preferable to reduce such separation to a minimum value (e.g. less than 5% of the lateral width of the semiconductor diode structures, and even more preferably less than 1% of the lateral width of the semiconductor diode structures).

In an embodiment, the light output section may comprise an aperture formed in the light reflecting structure.

Also, an embodiment may further comprise a layer of optical enhancement material below the light output section and at least partially overlapping both of the first and second semiconductor diode structures, wherein the light reflecting structure at least partially encloses side surfaces of the layer of optical enhancement material. In other words, an embodiment may further comprise a layer of optical enhancement material sandwiched between the top of the semiconductor light sources and the bottom of the light output section.

Further, in embodiments, the light output section may comprise an optical enhancement material.

Optical enhancement material may be a 'color conversion fill', such as a phosphorescent material. Examples may include a ceramic phosphor, a phosphor platelet, or a known phosphorescent material referred to as a "lumiramic" material. This may further help to maintain the etendue of the lateral emission area and/or change the color of the emitted light.

Further, if an embodiment comprises a plurality of light output sections, some or all of the light output sections may comprise (e.g. be filled) with different materials. As an example, certain light output sections may be filled with a first type of phosphor (e.g. converting blue to white) and others may be filled with another type of phosphor (e.g. converting blue to red).

Embodiments may be employed in the field of automotive lighting and other fields/applications where high-luminance lighting is desirable.

Thus, according to an aspect of the invention, there may be provided an automotive light comprising a light source according to an embodiment.

According to another aspect of the invention, there may be provided a projector light comprising a light source according to an embodiment.

According to yet another aspect of the invention, there is provided a method of manufacturing a light source comprising: arranging first and second semiconductor diode structures adapted to generate light to be laterally adjacent to each other; providing a light output section at least partially overlapping both of the first and second semiconductor diode structures, the light output section being adapted to output light from the first and second semiconductor diode structures; and at least partially enclosing sides surfaces of the first and second semiconductor diode structures and the light output section with a light reflecting structure, the light reflecting structure being adapted to reflect light from the semiconductor diode structures towards the light output section, wherein the area of the light output section is less than the combined area of the first and second semiconductor diode structures.

The step of arranging may comprise arranging the first and second semiconductor diode structures such that there is a lateral separation between the adjacent edges of the first and second semiconductor diode structures, the lateral separation being less than 10% of the lateral width of the first and second semiconductor diode structures.

The light output section may comprise an aperture formed in the light reflecting structure.

Embodiments may further comprise forming a layer of optical enhancement material below the light output section and at least partially overlapping both of the first and second semiconductor diode structures, wherein the step of at least partially enclosing sides surfaces of the first and second semiconductor diode structures and the light output section with a light reflecting structure light reflecting structure further comprise at least partially enclosing side surfaces of the layer of optical enhancement material with the light reflecting structure light reflecting structure.

In an embodiment, the light output section may comprise an optical enhancement material.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a light source comprising a plurality of LED light sources and a method for manufacturing the same. Embodiments may be of particular relevance to applications that require light of high or increased luminance from a relatively small and/or efficient light source.

Embodiments employ the concept of arranging light emitting semiconductor diode structures (such as LEDs) to be laterally adjacent and then providing a single light output section (of reduced size compared to the aligned diode structures) overlapping the adjacent diode structures. In this way, a common light output section may be employed or shared across multiple LED light sources to provide savings or reductions in materials and/or manufacturing complexity.

The term vertical, as used herein, means substantially orthogonal to the surface of a substrate. The terms lateral or horizontal, as used herein, means substantially parallel to the surface of a substrate. Also, terms describing positioning or locations (such as above, below, top, bottom, etc.) are to be construed in conjunction with the orientation of the structures illustrated in the diagrams.

The diagrams are purely schematic and it should therefore be understood that the dimensions of features are not drawn to scale. Accordingly, the illustrated thickness and/or separation of any of the layers should not be taken as limiting. For example, a first layer drawn as being thicker than a second layer may, in practice, be thinner than the second layer.

Figure 1A:
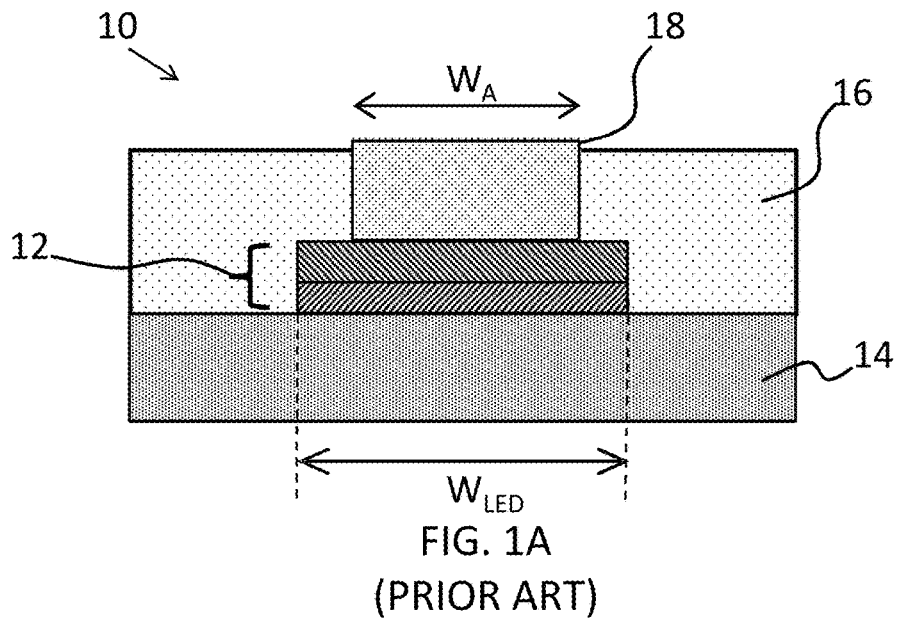
FIG. 1A is a cross-sectional view of a known LED light source.
Figure 1B:
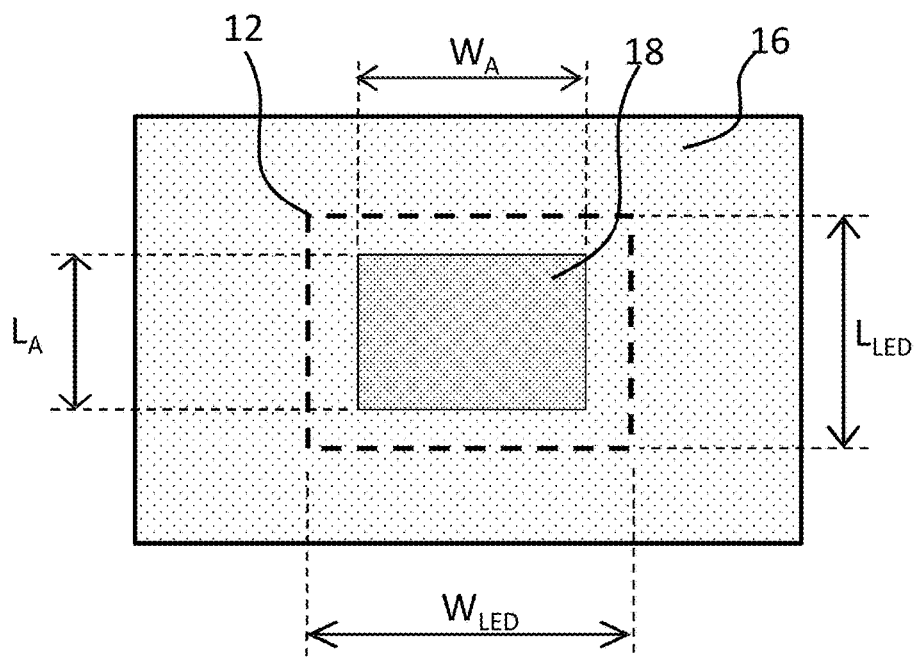
FIG. 1B is a plan view of the known LED light source of FIG. 1A.
Figure 2A:
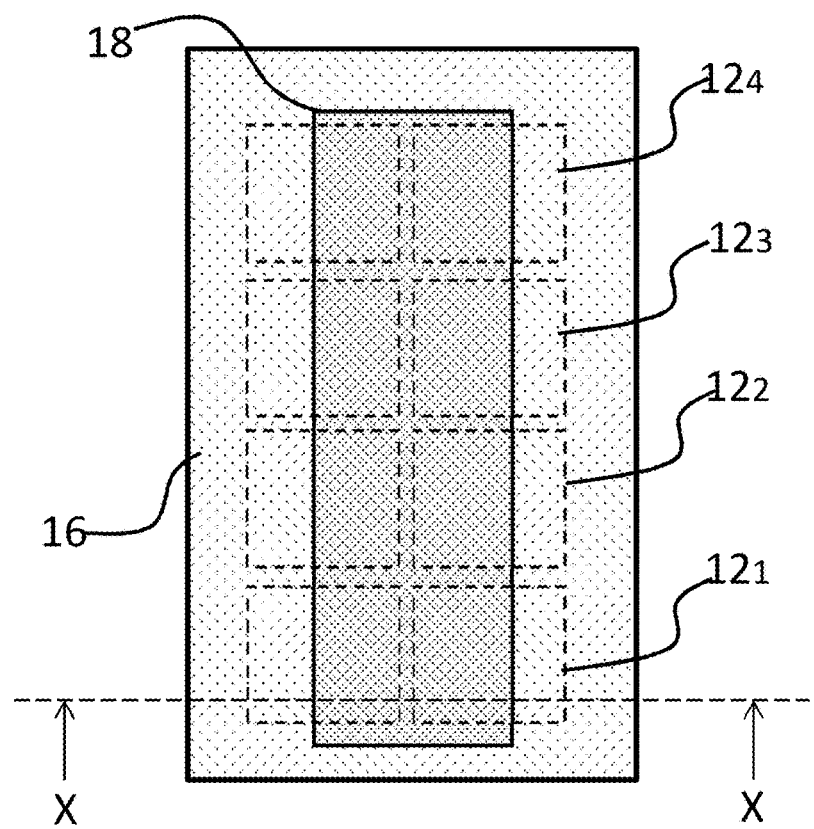
FIG. 2A is a plan view of a light source according to an embodiment.
Figure 2B:
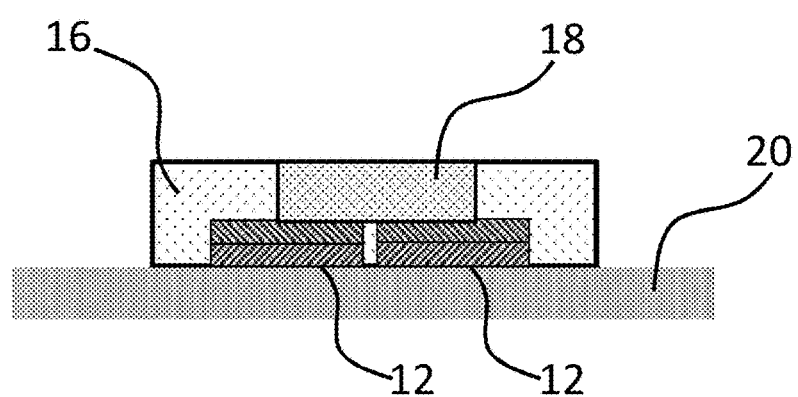
FIG. 2B is a cross-sectional view of the embodiment of FIG. 2A (taken along the line X-X of FIG. 2A)

Referring to FIG. 2, there is depicted a light source according to an embodiment of the invention. More specifically, FIG. 2A is a plan view of the light source, and FIG. 2B is a cross-sectional view of the light source (taken along the line X-X of FIG. 2A).

The light source comprises a plurality of LEDs 12 positioned on the upper surface of a substrate 20. Here, the plurality of LEDs 12 are arranged in a 2×4 array comprising two columns of LEDs 12, each column having four rows of LEDs 12. Thus, it will be appreciated that the depicted arrangement of LEDs 12 may be described as comprising four pairs $12_1, 12_2, 12_3, 12_4$ of closely-positioned LED light sources 12 which are aligned in a column to form a column-like array of pairs. Being positioned on the flat upper surface of the substrate, the LEDs 12 can be described as being laterally adjacent to each other since they all lie in the same horizontal plane.

A light output section 18 is provided on top of the LEDs 12 such that it partially overlaps the top/upper surface of each LED 12. The light output section 18 is adapted to output light from the LEDs 12. Here, the light output section 18 comprises an optical enhancement material such as phosphorescent material or a lumiramic.

Accordingly, when viewed from directly above (i.e. in plan view as depicted in FIG. 2A), a single elongate light output section 18 partially overlaps each pair of LEDs 12 in the 2×4 array. A single, common light output section 18 partially overlaps all of the LEDs.

A light reflecting structure 16 encloses the side surfaces of the LEDs 12 and the light output section 18, and also encloses the LED top/upper surfaces that are not covered by the light output section 18. Thus, the light reflecting structure 16 covers the LEDs 12 and light output section 18 such that only the top/upper surface of the light output section 18 is exposed (i.e. is not covered by the light reflecting structure 16). The light reflecting structure 16 comprises a highly reflective material that reflects light from LEDs 12 towards the light output section 18. The light reflecting structure 16 may therefore be considered as forming a light mix box from which light can only escape via the light output section 18.

Because the area of the light output section 18 is less than the total area of the LEDs, the embodiment employs the concept of having a light output section 18 which is smaller than the LEDs 12 it is adapted to output light from. This enables increased luminance from the LEDs 12 to be obtained. Furthermore, the use of a single light output section 18 partially overlapping multiple light generating structures (e.g. LEDs 12) enables a single component or structure to be employed and shared across multiple light sources. A reduction in device complexity and required materials can therefore be obtained.

Figure 3A:
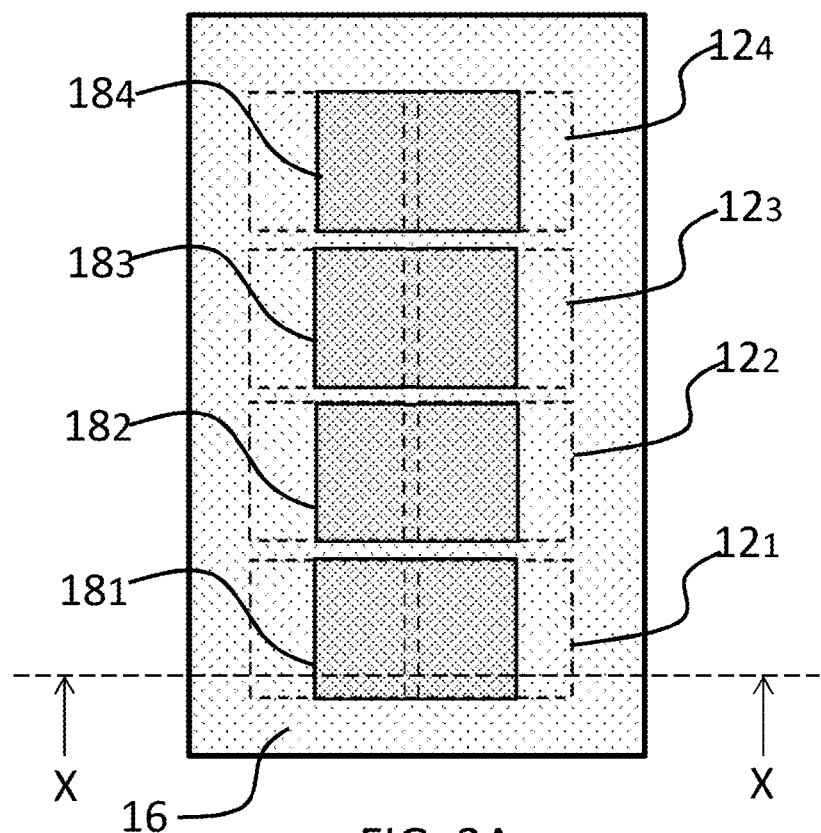
FIG. 3A is a plan view of a light source according to another embodiment.
Figure 3B:
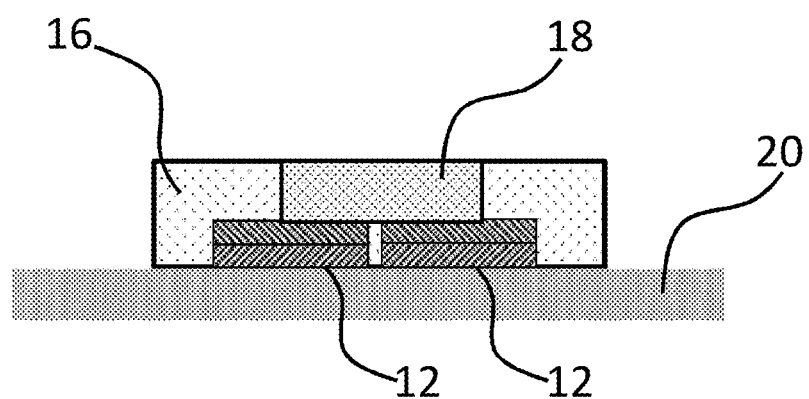
FIG. 3B is a cross-sectional view of the embodiment of FIG. 3A (taken along the line X-X of FIG. 3A)

Referring to FIG. 3, there is depicted a light source according to another embodiment of the invention. More specifically, FIG. 3A is a plan view of the light source, and FIG. 3B is a cross-sectional view of the light source (taken along the line X-X of FIG. 3A).

The embodiment of FIG. 3 is very similar to the embodiment of FIG. 2. Detailed description of all of the same or similar technical features will be omitted so as to avoid unnecessary repetition. Instead, it is noted that the embodiment of FIG. 3 only differ from that of FIG. 2 in that four light output sections $18_1, 18_2, 18_3, 18_4$ are employed. Each light output section 18 is arranged to partially overlap a respective pair of LEDs. Thus, a first light output section $18_1$ partially overlaps a first pair $12_1$ of LEDs, a second light output section $18_2$ partially overlaps a second pair $12_2$ of LEDs, a third light output section $18_3$ partially overlaps a third pair $12_3$ of LEDs, and a fourth light output section $18_4$ partially overlaps a fourth pair $12_4$ of LEDs. It will therefore be appreciated that each light output section 18 is arranged to partially overlap two LEDs.

As with the embodiment of FIG. 2, the area of a light output section 18 is less than the total area of the LEDs it partially covers, thus employing the concept of having a light output section 18 which is smaller than the LEDs 12 it is adapted to output light from. This enables increased luminance from the LEDs 12 to be obtained. Furthermore, the use of a single light output section 18 partially overlapping two light generating structures (e.g. LEDs 12) enables a reduction in materials and complexity whist providing for light of increased luminance from the light source. It may also enable a similar layout of light outputting areas as current devices, which can assist implementation in existing products.

Figure 4A:
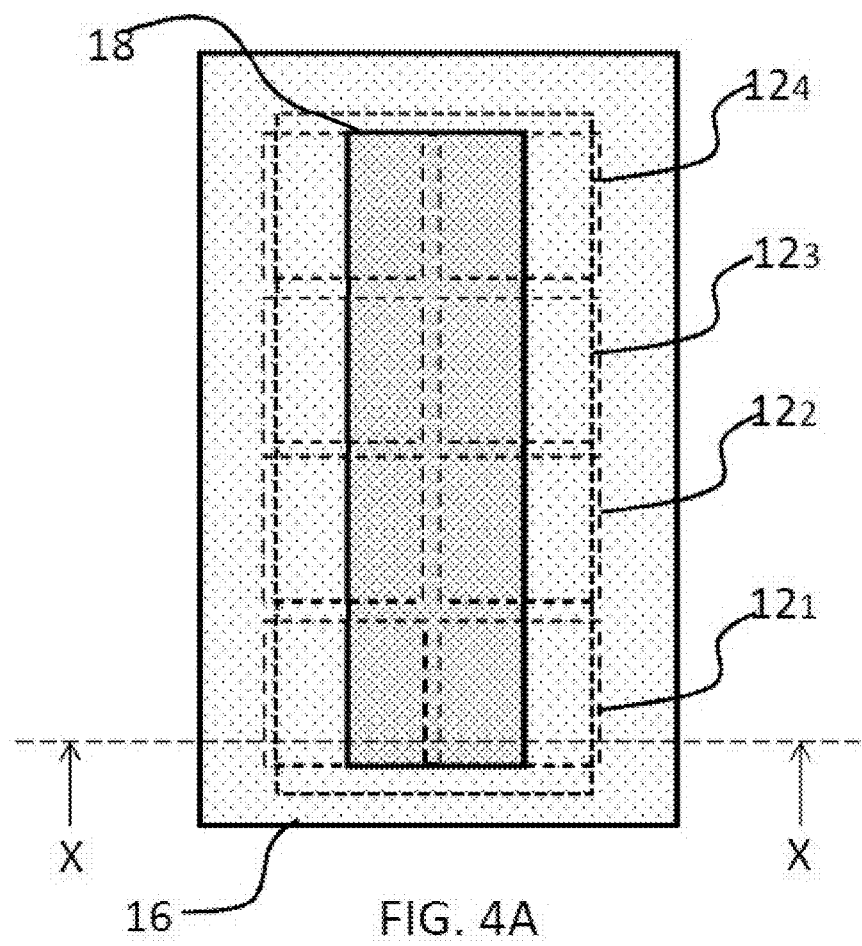
FIG. 4A is a plan view of a light source according to another embodiment.
Figure 4B:
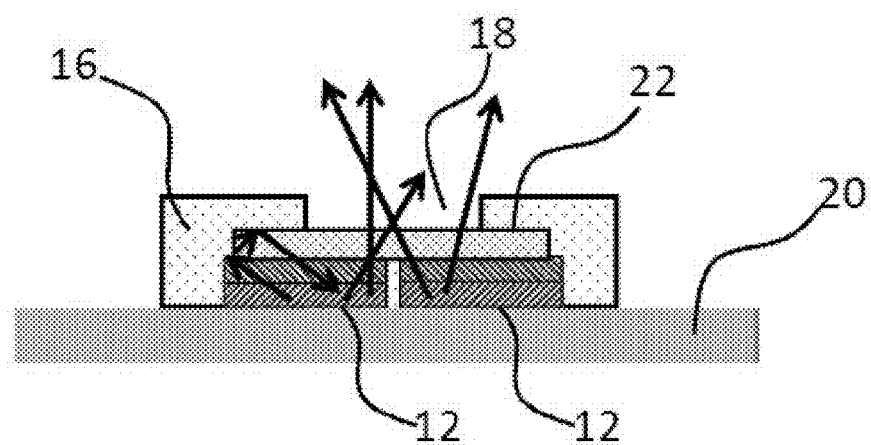
FIG. 4B is a cross-sectional view of the embodiment of FIG. 4A (taken along the line X-X of FIG. 4A)

Referring to FIG. 4, there is depicted a light source according to another embodiment of the invention. More specifically, FIG. 4A is a plan view of the light source, and FIG. 4B is a cross-sectional view of the light source (taken along the line X-X of FIG. 4A).

The embodiment of FIG. 4 is similar to the embodiment of FIG. 2. Detailed description of all of the same or similar technical features will be omitted so as to avoid unnecessary repetition. Instead, it is noted that the embodiment of FIG. 4 differs from that of FIG. 2 in that the single light output section 18 now comprises an aperture 18 (formed in the light reflecting structure 16). As with the embodiment of FIG. 2, the light output section 18 (i.e. aperture18) of the embodiment of FIG. 4 is situated above the LEDs 12 such that it partially overlaps each LED 12. Further, the shape and size of the light output section 18 of FIG. 4 is very similar to that of FIG. 2. Thus, the area of the light output section 18 is less than the total area of the LEDs it overlaps, thereby employing the concept of having a light output section 18 which is smaller than the LEDs 12 it is adapted to output light from.

Also, there is provided a layer 22 of optical enhancement material below the light output section 18 and overlapping all of the LEDs 12. Here, the light output optical enhancement material comprises a lumiramic or phosphorescent material which is adapted to convert the color of light emitted by the LEDs.

The light reflecting structure 16 covers the side surfaces of the layer 22 of optical enhancement material as well as a portion of the upper surface of the layer 22 of optical enhancement material. In other words, the light reflecting structure 16 covers the LEDs 12 and layer 22 of optical enhancement material such that only the top/upper surface of layer 22 of optical enhancement material is exposed (i.e. uncovered) by the light output section 18.

Hence, it will be appreciated the FIG. 4 illustrates an embodiment wherein the light output section 18 comprises an aperture or cavity. The layer 22 of optical enhancement material is provided in this embodiment to alter the color of light emitted by the LEDs 12. However, it will be appreciated that the embodiment of FIG. 4 may be modified to not include the layer 22 of optical enhancement material (if alteration of the color of light from the LEDs is not required, for example).

Figure 5:
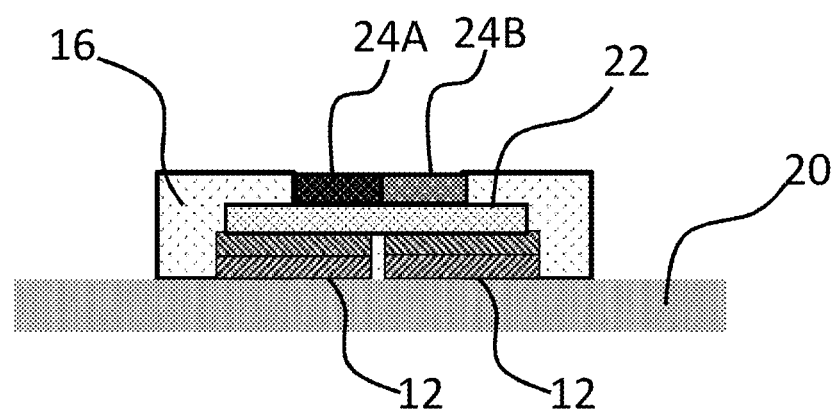
FIG. 5 illustrates a modification to the embodiment of FIGS. 4A and 4B.

Alternatively, the embodiment of FIG. 4 may be modified by replacing the aperture 18 of FIG. 4 with optical enhancement material (such as lumiramic or phosphorescent material, for example). Such a modification to the embodiment of FIG. 4 is depicted in FIG. 5, wherein the light output section comprises first 24A and second 24B portions of phosphorescent material. The first 24A and second 24B portions of phosphorescent material may provide for the alteration of output light to different colors, for example.

Figure 6:
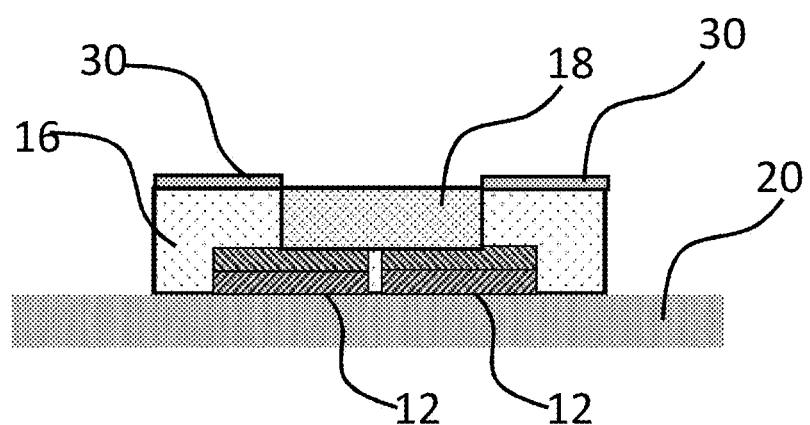
FIG. 6 illustrates a modification to the embodiment of FIGS. 2A and 2B.

It is noted that, in practice, the light reflecting structure 16 may not be entirely reflecting. In other words, the light reflecting structure may not have substantially 100% reflectivity, and so some light may leak through it. This increases the size of the light outputting area and hence reduces luminance. This may introduce color over position effects (e.g. a blue halo around white light in the center). To address this, embodiments may be made "light leak tight" by blocking the light with an opaque/reflective coating. Such a modification to the embodiment of FIG. 2 is depicted in FIG. 6, wherein a reflective coating 30 is provided on the upper surface of the light reflecting structure 16. This helps to lower the overall light transmittance of the light reflecting structure 16 by reflecting light that is incident on the lower surface of the reflective coating 30 from below (e.g. light leaking through the light reflecting structure 16).

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A light source, comprising:
   a substrate;
   a first semiconductor diode structure and a second semiconductor diode structure arranged laterally adjacent to each other on the substrate;
   a light output section at least partially overlapping the first and the second semiconductor diode structures, the light output section being adapted to output light from the first and the second semiconductor diode structures;
   a layer of optical enhancement material between the light output section and at least a portion of the first semiconductor diode structure and a portion of the second semiconductor diode structure, and
   a light reflecting structure on the substrate that at least partially encloses the light output section and side surfaces of the first semiconductor diode structure, the second semiconductor diode structure, and the layer of optical enhancement material; the light reflecting structure being in contact with the side surfaces of the first semiconductor diode structure, the second semiconductor diode structure, and the layer of optical enhancement material; the light reflecting structure being in contact with portions of top surfaces of the first semiconductor diode structure, the second semiconductor diode structure, and the layer of optical enhancement material, wherein:
   the light reflecting structure is adapted to reflect light from the first and the second semiconductor diode structures towards the light output section,
   an area of the light output section in a cross section parallel to the top surfaces of the first and the second semiconductor diode structures is less than combined areas of the top surfaces of the first and the second semiconductor diode structures and less than an area of the layer of optical enhancement material in a cross section parallel to the top surfaces of the first and the second semiconductor diode structures, and
   a lateral separation between adjacent edges of the first and the second semiconductor diode structures is less than 10% of a lateral width of at least one of the first and the second semiconductor diode structures.

2. The light source of claim 1, wherein the light output section comprises an aperture formed in the light reflecting structure.

3. The light source of claim 1, wherein the layer of optical enhancement material covers the combined areas of the first semiconductor diode structure and the second semiconductor diode structure.

4. The light source of claim 2, wherein the aperture of the light output section comprises no optical enhancement material.

5. The light source of claim 1, wherein at least one of the first semiconductor diode structure and the second semiconductor diode structure comprises a pre-structured sapphire LED.

6. The light source of claim 1, further comprising a reflective coating at least partially overlapping the light reflecting structure.

7. The light source of claim 1, further comprising an automotive light.

8. The light source of claim 1, further comprising a projector light.

9. A method of manufacturing a light source, comprising:
   arranging a first semiconductor diode structure and a second semiconductor diode structure to be laterally adjacent to each other on a substrate such that there is a lateral separation between adjacent edges of the first and the second semiconductor diode structures is less than 10% of at least one of a lateral width of the first and the second semiconductor diode structures;
   forming a layer of optical enhancement material on at least a portion of the first semiconductor diode structure and a portion of the second semiconductor diode structure; and
   providing a light reflecting structure on the substrate that (1) covers and contacts portions of top surfaces of the first semiconductor diode structure, the second semiconductor diode structure, and the layer of optical enhancement material to define a light output section and (2) at least partially encloses and contacts sides surfaces of the first semiconductor diode structure, the second semiconductor diode structure, and the layer of optical enhancement material; the light reflecting structure being adapted to reflect light from the first and the second semiconductor diode structures towards the light output section, wherein an area of the light output section in a cross section parallel to the top surfaces of the first and the second semiconductor diode structures is less than combined areas of the top surfaces of the first and the second semiconductor diode structures and less than an area of the layer of optical enhancement material in a cross section parallel to the top surfaces of the first and the second semiconductor diode structures.

10. The method of claim 9, wherein the light output section comprises an aperture formed in the light reflecting structure.

11. The method of claim 9, wherein forming a layer of optical enhancement material includes covering the combined areas of the first semiconductor diode structure and the second semiconductor diode structure.

12. The method of claim 10, wherein the aperture of the light output section comprises no optical enhancement material.

13. The method of claim 9, further comprising, providing at least a portion of an automotive light.

14. The method of claim 9, further comprising, providing at least a portion of a projector light.

15. The method of claim 9, further comprising, providing at least a portion of a camera flashlight.

16. The method of claim 9, further comprising, providing at least a portion of a spot light.

17. The light source of claim 1, further comprising a camera flashlight.

18. The light source of claim 1, further comprising a spot light.

* * * * *